(12) United States Patent
Luo et al.

(10) Patent No.: US 12,272,534 B2
(45) Date of Patent: Apr. 8, 2025

(54) PLASMA VIEWPORT

(71) Applicant: Lam Research Corporation, Fremont, CA (US)

(72) Inventors: Bin Luo, Beaverton, OR (US); Andrew H. Breninger, Hillsboro, OR (US); John Michael Wiltse, Lake Oswego, OR (US); Brian Lewis Ratliff, Hillsboro, OR (US); David James Shusteric, San Jose, CA (US)

(73) Assignee: LAM RESEARH CORPORATION, Fremont, CA (US)

( * ) Notice: Subject to any disclaimer, the term of this patent is extended or adjusted under 35 U.S.C. 154(b) by 171 days.

(21) Appl. No.: 17/753,084

(22) PCT Filed: Aug. 21, 2020

(86) PCT No.: PCT/US2020/070438
§ 371 (c)(1),
(2) Date: Feb. 17, 2022

(87) PCT Pub. No.: WO2021/042117
PCT Pub. Date: Mar. 4, 2021

(65) Prior Publication Data
US 2022/0301835 A1    Sep. 22, 2022

Related U.S. Application Data

(60) Provisional application No. 62/891,213, filed on Aug. 23, 2019.

(51) Int. Cl.
*H01J 37/32* (2006.01)
*G02B 7/00* (2021.01)

(52) U.S. Cl.
CPC ........ *H01J 37/32935* (2013.01); *G02B 7/007* (2013.01); *H01J 37/32798* (2013.01); *H01J 37/32091* (2013.01)

(58) Field of Classification Search
CPC ..................... H01J 37/32798; H01J 37/32935
See application file for complete search history.

(56) References Cited

U.S. PATENT DOCUMENTS

| | | |
|---|---|---|
| 4,809,862 A | 3/1989 | Canty |
| 6,562,186 B1 | 5/2003 | Saito et al. |

(Continued)

FOREIGN PATENT DOCUMENTS

| | | |
|---|---|---|
| EP | 3453783 A2 | 3/2019 |
| JP | 2008306211 A | 12/2008 |

(Continued)

OTHER PUBLICATIONS

International Preliminary Report on Patentability dated Mar. 3, 2022, in Application No. PCT/US2020/070438.

(Continued)

*Primary Examiner* — Joseph A Miller, Jr.
(74) *Attorney, Agent, or Firm* — Alleman Hall & Tuttle LLP

(57) ABSTRACT

Plasma viewports for high-temperature environments in semiconductor processing equipment are disclosed; such viewports may use a triple-window design, with each window providing particular functionality.

19 Claims, 5 Drawing Sheets

(56) References Cited

U.S. PATENT DOCUMENTS

| | | | |
|---|---|---|---|
| 2002/0014203 A1* | 2/2002 | Kim ................. | G02B 7/007 |
| | | | 118/713 |
| 2003/0173029 A1 | 9/2003 | Saito et al. | |
| 2003/0188881 A1 | 10/2003 | Stark | |
| 2004/0020439 A1 | 2/2004 | Chen et al. | |
| 2006/0112879 A1 | 6/2006 | Lee et al. | |
| 2010/0310797 A1 | 12/2010 | Mansour, II | |
| 2014/0024142 A1* | 1/2014 | Shriner ............ | H01J 37/32522 |
| | | | 118/723 R |
| 2019/0056532 A1 | 2/2019 | Schwartz | |

FOREIGN PATENT DOCUMENTS

| | | |
|---|---|---|
| KR | 1020080030557 A | 4/2008 |
| WO | WO-03083938 A1 | 10/2003 |
| WO | 2006121954 A2 | 11/2006 |

OTHER PUBLICATIONS

PCT/US2020/070438, International Search Report and Written Opinion, Dec. 2, 2020, 14 pages.

Japan Patent Office, Office Action Issued in Application No. 2022-512292, May 21, 2024, 10 pages.

China National Intellectual Property Administration, Office Action and Search Report Issued in Application No. 202080059834.3, Oct. 7, 2023, 20 pages.

* cited by examiner

PLASMA VIEWPORT

RELATED APPLICATIONS

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools often include semiconductor processing chambers that may be equipped with gas flow components and radio-frequency generators and electrodes that are configured to allow a plasma to be struck and maintained within the processing chamber. Such plasmas are typically generated in the region directly above where a semiconductor wafer is positioned within the chamber.

In some such equipment, a viewport is included in the wall of the chamber to allow an outside observer, e.g., equipment operator, to look inside the chamber and observe the plasma (or other aspects of the interior of the chamber).

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a frame defining an aperture and a sapphire window positioned adjacent to the frame, sized larger than the aperture, and completely overlapping the aperture when viewed along a direction perpendicular to a largest surface of the sapphire window. The apparatus may further include a glass window and a polymeric window. The glass window may be interposed between the sapphire window and the polymeric window.

In some implementations, the apparatus may further include a first elastomeric O-ring that is interposed between the sapphire window and the frame. In some further such implementations, the apparatus may also include a second elastomeric O-ring interposed between the glass window and the polymeric window.

In some implementations, the glass window may be made of a borosilicate glass or a soda lime glass.

In some implementations, the glass window may have a composition by weight of 70% silica, 11.5% boron oxide, 9.5% sodium oxide, 7.5% potassium oxide, 1% barium oxide, with the remainder including titanium oxide, calcium oxide, and any impurities.

In some implementations, Schott N-BK7 glass or an equivalent thereof may be used for the glass window.

In some implementations, the frame may include a perforated web that spans the aperture, the perforated web having a pattern of through-holes sized approximately 4 millimeters or less in diameter.

In some implementations, the through-holes may be arranged in a hexagonal lattice pattern.

In some implementations, the perforated web may be interposed between the sapphire window and the glass window.

In some implementations, the frame may be made from an aluminum alloy and at least a surface on a side of the frame adjacent to the sapphire window may have a hard-anodized coating.

In some implementations, the polymeric window may be made of a polycarbonate material.

In some implementations, the polymeric window, when viewed along the direction perpendicular to the largest surface of the sapphire window, may completely overlap the frame.

In some implementations, the polymeric window may be held in place relative to the frame using fasteners such as star-point screws (such as Torx-head screws), anti-tamper star-point screws, spanner head screws, one-way screws, or other anti-tamper screws.

In some implementations, the apparatus may further include a wall having a receptacle sized to receive the frame. In such implementations, the frame may be set in the receptacle and the receptacle may include an interior flange, the interior flange may define an opening, and the sapphire window may be sized larger than the opening. The apparatus may also include an elastomeric O-ring that is interposed between the sapphire window and the interior flange.

In some such implementations, the elastomeric O-ring may be compressed between the interior flange and the sapphire window.

In some further such implementations, the apparatus may further include a semiconductor processing chamber, and the wall may be a wall of the semiconductor processing chamber.

In some further implementations, the apparatus may further include a radio frequency (RF) generator and an RF electrode. In such implementations, the RF generator may be electrically connected to the RF electrode and configured to generate a plasma within the semiconductor processing chamber using the RF electrode. Furthermore, the receptacle in such implementations may be positioned in the wall such that there is a line of sight through the sapphire window, the glass window, and the polymeric window to a location in the semiconductor processing chamber where the RF generator and the RF electrode are configured to generate the plasma.

In some implementations, a semiconductor processing tool may be provided that includes: a semiconductor processing chamber, the semiconductor processing chamber having an exterior wall; a radio-frequency (RF) generator; an RF electrode located within the semiconductor processing chamber; and a plasma viewport. The plasma viewport may include: a frame defining an aperture, a sapphire window positioned adjacent to the frame, sized larger than the aperture, and completely overlapping the aperture when viewed along a direction perpendicular to a largest surface of the sapphire window, a glass window, and a polymeric window. In such an implementation, the glass window may be interposed between the sapphire window and the polymeric window.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 1 through 4 are drawn to scale within each Figure, although the scale from Figure to Figure may vary.

DETAILED DESCRIPTION

Figure 1:
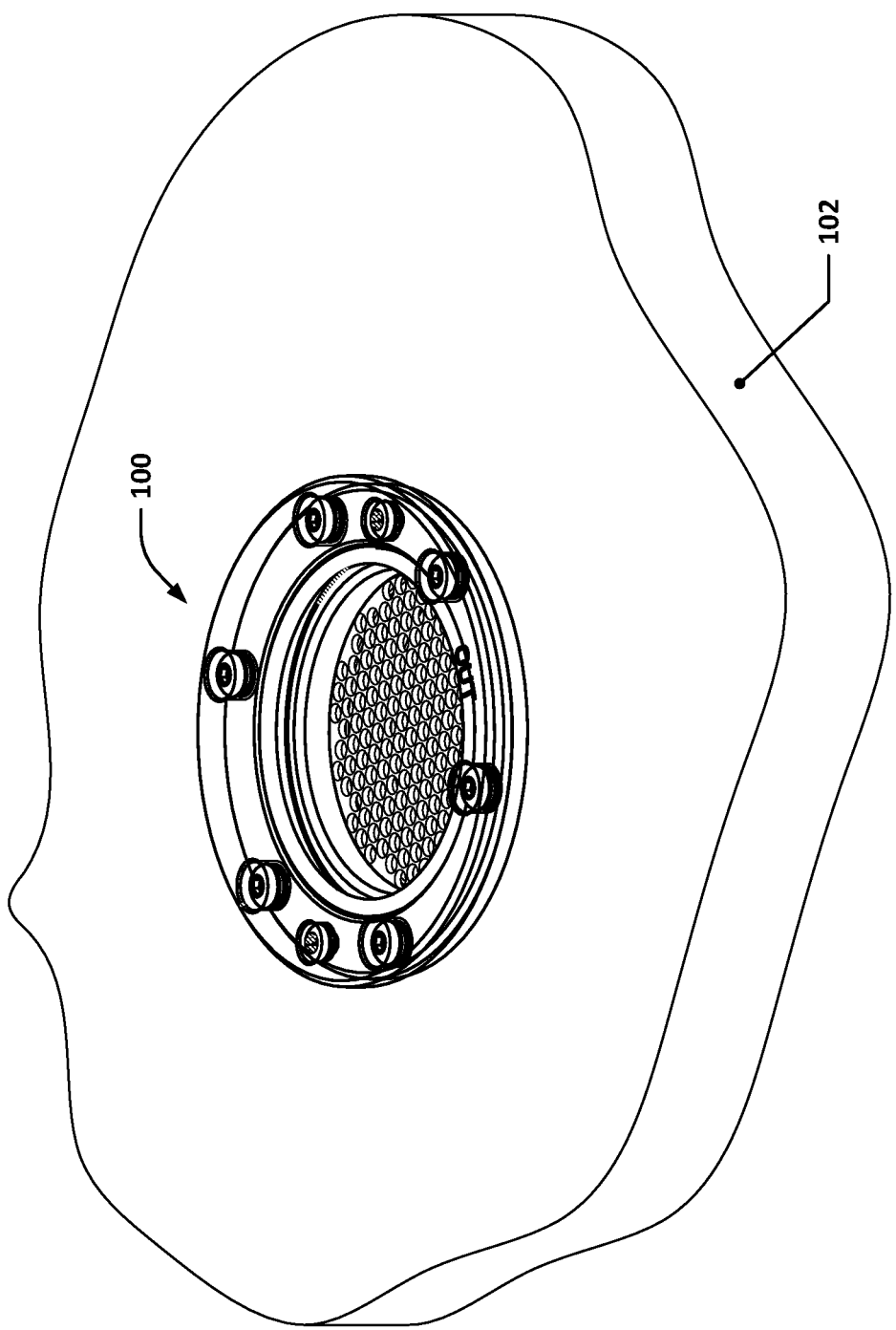
FIG. 1 depicts an isometric view of an example plasma viewport set into a portion of a wall.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and the like are used interchangeably. A wafer or substrate used in the semiconductor device industry typically has a diameter of 200 mm, 300 mm, or 450 mm, but may also be non-circular and of other dimensions. In addition to semiconductor wafers, other work pieces that may take advantage of this invention include various articles such as printed circuit boards, magnetic recording media, magnetic recording sensors, mirrors, optical elements, micro-mechanical devices and the like.

As mentioned above, in some semiconductor processing chambers, a plasma viewport may be included in the side wall (or other wall) of the chamber to allow for visual inspection of the interior of the processing chamber during semiconductor processing operations. In particular, such plasma viewports may be positioned and configured such that a person, e.g., technician or process engineer, may look inside of the process chamber in order to visually inspect the interior of the process chamber and evaluate whether a plasma housed within the chamber has an expected appearance. In particular, the plasma viewports discussed herein may be particularly suited for use in high-temperature processing chambers, e.g., chambers in which the pedestal used to support a wafer during semiconductor processing operations may reach temperatures of 600° C. to 700° C., the showerhead that distributes gas over the wafer during such processing operations may reach temperatures of 300° C. to 360° C., e.g., 350° C., and the plasmas that are generated within the processing chamber may reach temperatures of ~4500° C. Due to such high internal temperatures, as well as the effects of ultraviolet radiation that may be released by the plasma generated within the processing chamber, the plasma viewport may exhibit increased temperature effects that render it unsuitable for use.

For example, semiconductor processing tools are typically required to adhere to certain performance requirements, some of which govern the acceptable temperature limits that portions of the semiconductor processing tool may reach during normal processing operations. For example, metal external surfaces of a semiconductor processing tool may be required to not exceed 65° C., and plastic external surfaces of a semiconductor processing tool may be required to not exceed 85° C. Both temperature limits, which may be referred to as "touch-safe" or "safe-touch" temperature limits, are selected such that a person that touches such external surfaces with a body part will not suffer burns to their skin before being able to withdraw the body part from contact, e.g., temperatures that are safe for human contact for up to 5 seconds. Metal surfaces, due to the higher thermal conductivity of metal and thus greater heat transfer rate into human skin, have a lower threshold temperature than plastic surfaces do. For example, touching a metal surface at 85° C. for five seconds may allow sufficient heat energy to be conducted from the metal surface into the skin that a burn may occur, whereas touching a plastic surface at the same temperature for the same time interval may, due to the lower thermal conductivity of plastics, not cause enough heat energy to be conducted into the skin that would cause a burn.

In high-temperature semiconductor processing chambers, such as those described above, the amount of heat that is generated may be significantly more than the typical amount of heat generated within a semiconductor processing chamber normally. As a result, a plasma viewport for such a processing chamber may experience greater than normal heating effects, which may cause one or more portions of the plasma viewport to reach temperatures that may either cause portions of the plasma viewport to fail and/or exceed the permissible safe-touch temperatures.

Provided herein are new plasma viewport designs that may provide superior resistance to high-temperature thermal environments. FIG. 1, for example, depicts an isometric view of such an enhanced example plasma viewport set into a portion of a wall. The view provided in FIG. 1 is the view that would be seen from the exterior of the processing chamber looking in, with a plasma viewport 100 being mounted in a wall 102 of the processing chamber.

Figure 2:
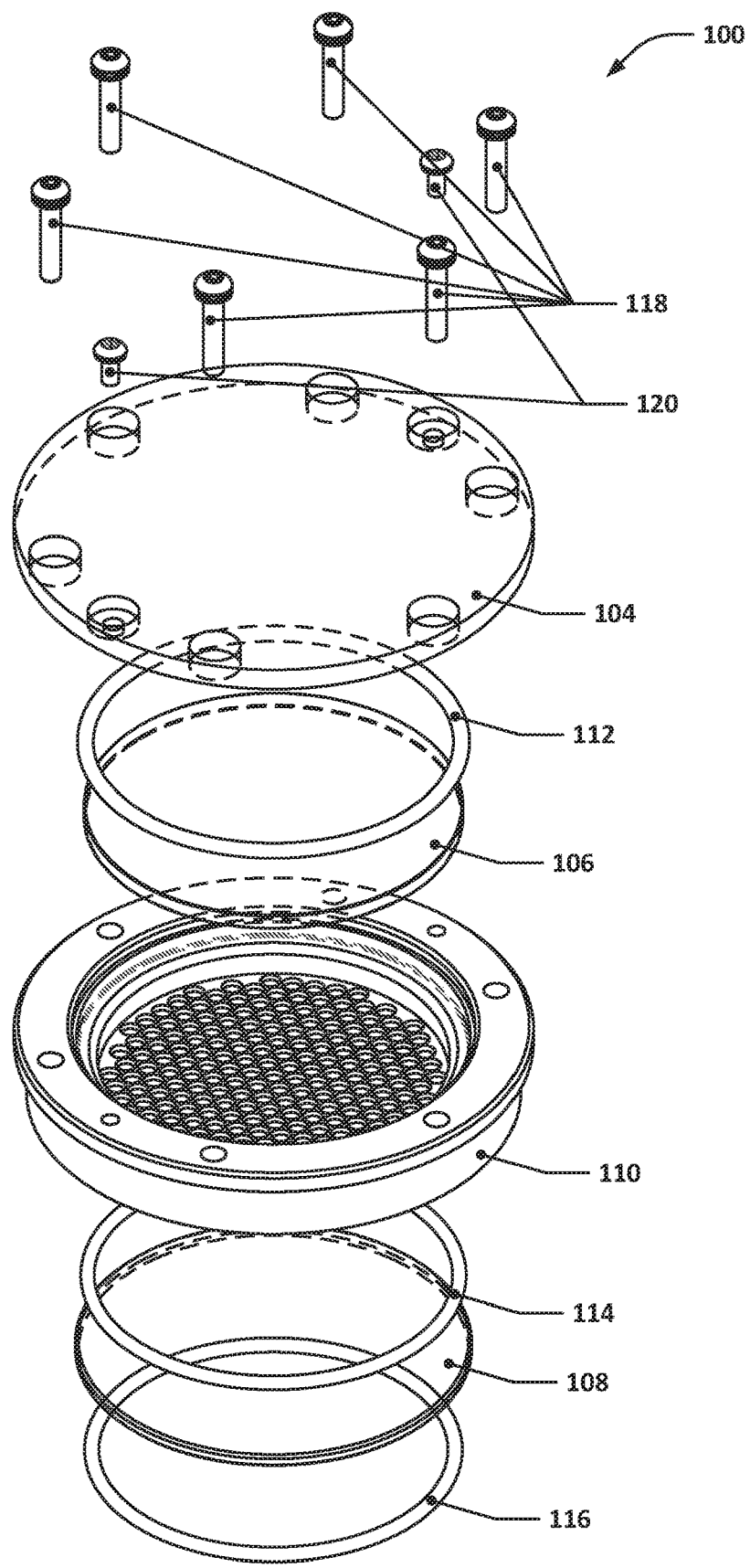
FIG. 2 depicts an isometric exploded view of the example plasma viewport of FIG. 1.

FIG. 2 depicts an isometric exploded view of the example plasma viewport of FIG. 1. As can be seen, the plasma viewport 100 may include a frame 110 that may serve to support a plurality of windows in a spaced-apart configuration. For example, the plasma viewport 100 may include a sapphire window 108, a glass window 106, and a polymeric window 104, with the glass window 106 interposed between the sapphire window 108 and the polymeric window 104.

The sapphire window 108 may be positioned so as to serve as a barrier between the processing gas environment within the processing chamber and the remainder of the windows of the plasma viewport. The sapphire (aluminum oxide) window 108 may, for example, provide a chemically resistant transparent surface that may protect, for example, the glass window 106 from chemical attack, e.g., from fluorine-containing processing gases that may be present in the processing chamber. Other types of material may be used for the sapphire window as well, including, for example, aluminum magnesium oxide ($Al_2MgO_4$, also known as spinel, which may be offered in optically transparent forms). Generally speaking, the window 108 may be made of any fluorine-resistant, high-temperature stable material that is generally optically transmissive in the visual spectrum. Such materials may also, in some instances, be at least partially optically non-transmissive (which may include significantly reduced transmissivity but not complete non-transmissivity) in the ultraviolet spectrum. For example, sapphire may generally transmit 80-90% of light in at least 80% of the visual light spectrum (380 nm to 740 nm), but such transmissivity may rapidly decrease with wavelengths in the ultraviolet spectrum, e.g., 80% at 300 nm wavelength, 60% at 200 nm wavelength, 40% at 150 nm wavelength, and less than 10% at the bottom end of the UV spectrum of 100 nm wavelength. Sapphire is also resistant to thermal shock, capable of withstanding prolonged exposure to temperatures of 650° C. or more, and chemically inert. Other materials with similar characteristics, e.g., having one or more or two or more such characteristics, or values for such characteristics within ±10% or ±20% of such values, may be utilized in some implementations. Fluorine-resistant materials are materials that are generally chemically inert when exposed to a fluorine-containing environment; there may be some degradation of such materials over long time spans, but they are generally able to survive prolonged periods of time, e.g., years, of exposure to fluorine environments without suffering noticeable degradation.

The glass window 106 may, for example, be a borosilicate glass, such as Schott N-BK7 glass or equivalents thereof, e.g., a glass with a composition by weight of 70% silica, 11.5% boron oxide, 9.5% sodium oxide, 7.5% potassium oxide, 1% barium oxide, with the remainder including titanium oxide, calcium oxide, and any impurities; another alternative is soda lime glass. Various other suitable equivalents that offer effective UV filtering while offering high optical transmissivity to visual light may be used. For example, N-BK7 glass transmissivity of light in the visual spectrum (for a 3 mm thick window) may be on the order of 90% in the range of 350 nm to 2000 nm wavelength, but may rapidly drop off to 80% at 325 nm wavelength, 40% at 300 nm wavelength, and less than 25% at 275 nm. N-BK7 glass may also generally be temperature stable up to approximately 500° C. Other materials with similar characteristics, e.g., having one or more or two or more such characteristics, or values for such characteristics within ±10% or ±20% of such values, may be utilized in some implementations. The glass window 106 may serve to act as an ultraviolet filter, thereby screening out ultraviolet radiation that may be released by the plasma during processing operations. Such ultraviolet radiation may cause excessive heating of the polymeric window 104. In particular, the sapphire window 108 may allow a large amount of ultraviolet radiation to be transmitted therethrough, resulting in the polymeric window 104 receiving a large amount of ultraviolet radiation that may cause localized heating of the polymeric window 104. Such localized heating of the polymeric window may be reduced or mitigated through the use of the glass window 106 that is interposed between the polymeric window 104 and the sapphire window 108. Borosilicate glasses, such as N-BK7, may have an optimum transmission range of 350 nm to 2000 nm, falling off to less than 20% below ~270 nm. Ultraviolet radiation generally ranges in wavelength from 400 nm down to 10 nm, so the glass window 106 may, if made of a glass such as BK7, act to screen out a large amount of UV radiation, thereby lowering the amount of heat energy conveyed to the polymeric window 104.

The polymeric window 104 may serve multiple purposes. For example, the polymeric window 104 may act to protect the glass window 106 and/or the sapphire window 108 from impacts or other potential damage, may provide a transparent barrier that can be looked through, may act to cover the metal frame 110 that may otherwise be exposed, and may also provide one last level of shielding or filtering for UV radiation, thereby protecting the operator from UV exposure. Thus, the portion of the plasma viewport that is exposed to potential human contact may be the polymeric window 104, which can reach a higher touch-safe temperature than the metal frame 110. The polymeric window may be made from any of a variety of transparent plastics, including, for example, polycarbonate, acrylonitrile butadiene styrene, acrylic, styrene methyl methacrylate, and so forth. In some implementations, the polymeric window 104 may be sized so as to completely overlap the frame 110 when viewed along a direction normal to the plane of the polymeric window 104, e.g., the major surface of the polymeric window 104, thereby ensuring that there is no part of the frame 110 that may be exposed to human touch. Such polymeric windows may be made of materials that are, generally speaking, optically transmissive to visual light, optically non-transmissive to ultraviolet light, and having relatively low thermal conductivity as compared, for example, with the thermal conductivity of the glass window 106, e.g., 50%, 40%, 30%, 20% or less than that of the glass window 106. For example, some polycarbonates may offer between 80-90% transmissivity in the visual light spectrum and zero transmissivity to light in the 390 nm wavelength range and lower, while having thermal conductivity of ~0.2 W/mK as compared with ~1.1 W/mK for borosilicate glass (<20% of that of borosilicate glass). The reduced thermal conductivity may reduce the rate at which heat from the polymeric window can be transmitted to a person's dermis that may come into contact therewith, thereby providing sufficient time for the person to withdraw from contacting the polymeric window without suffering a burn. In some instances, the window 108, the window 106, and the window 104 may be referred to herein as the first window, the second window, and the third window, respectively.

Some of the various windows of the plasma viewport 100 may be retained in placed and/or sealed using various o-rings or similar elastomeric structures. For example, the glass window 106 may be lightly compressed against the frame 110 by a first O-ring 112. The sapphire window 108 may, in turn, be sealed against the frame 110 by a second o-ring 114. A third o-ring 116 may be provided on the other side of the sapphire window 108 to allow the sapphire window 108 to be sealed against, for example, a wall of the semiconductor processing chamber. The second O-ring 114 and may also act to load the sapphire window 108 against the third O-ring 116 without introducing contact with a hard surface, in some implementations. A plurality of fasteners 118 may be inserted through holes in the frame and used to secure the frame into a suitably sized recess in a wall of a semiconductor processing chamber. Similarly, the polymeric window 104 may be secured in place through the use of second fasteners 120, for example. In some implementations, the fasteners used to secure the polymeric window 104 in place may be tamper-resistant or tamper-proof fasteners, or at least a less common type of fastener, e.g., star-point screws such as Torx-head screws that may be selected to make it more difficult to disassemble the plasma viewport assembly, thereby reducing the risk that a user might remove the polymeric window and the glass window, and then reassemble the plasma viewport assembly without the glass window, thereby losing the UV filtering functionality of the glass window. Additionally, the frame 110 may, in some implementations, have a perforated web 124 that may span across the aperture of the frame 110. The perforated web 124 may act to prevent RF radiation from escaping from the processing chamber, e.g., much like a Faraday cage. In some implementations, such as that pictured, the perforated web 124 may be in between the sapphire window 108 and the glass window 106; in other implementations, the perforated web 124 may instead be between the glass window 106 and the polymeric window 104.

Figure 3:
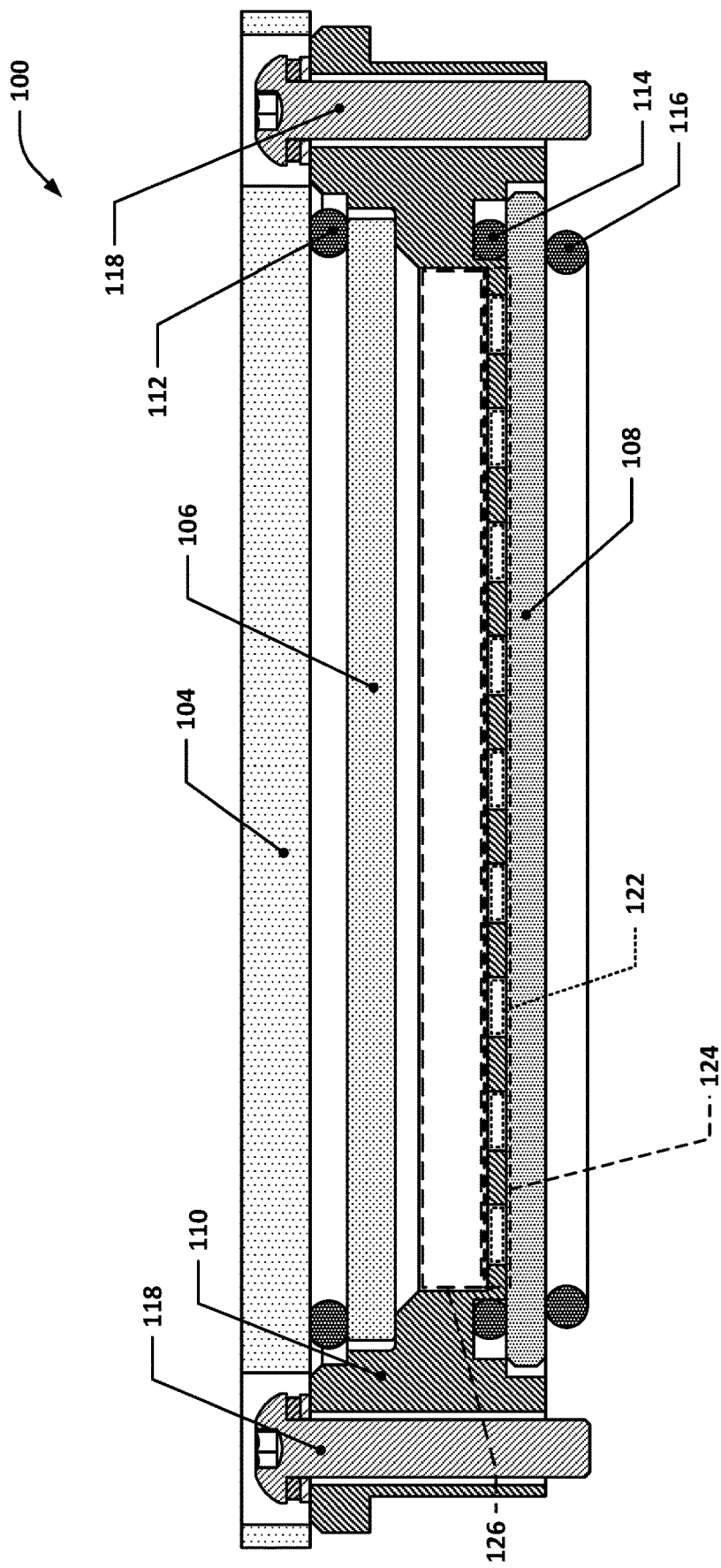
FIG. 3 depicts a side section view of the example plasma viewport of FIG. 2.

FIG. 3 depicts a side section view of the example plasma viewport of FIG. 2. As can be seen in FIG. 3, the frame 110 may include a plurality of features, including through-holes for fasteners 118 to pass through to allow the frame 110 to be bolted into a receptacle in a wall of a semiconductor processing chamber, an aperture 126 that may serve as the opening through which an observer may peer through the plasma viewport 100, an O-ring groove or gland that may receive an O-ring (such as the second O-ring 114 in FIG. 3), and various ledges and steps that may serve to center and support some or all of the various windows that are included in the plasma viewport 100. As mentioned previously, one of the features that the frame may include is the perforated web 124, which may have a pattern of through-holes 122 through it. In the example shown, the pattern is a hexagonal or triangular lattice pattern (a pattern in which the centers of items in the pattern may define vertices of a regular hexagon), although other hole patterns may be used (the holes may also be shapes other than circular holes, if desired).

The polymeric window 104 may be designed such that it has clearance holes for each fastener 118 to allow the fasteners 118 to be tightened without concern that the polymeric window 104 will be subjected to undue compression by the fasteners 118 that may cause the polymeric window to crack or otherwise fail. This allows the fasteners 118 to be torqued to levels that ensure, for example, that the second O-ring 114 and the third O-ring 116 are compressed to a level sufficient to provide a sufficient level of vacuum sealing around the plasma viewport 100 that atmospheric gases are not drawn into the processing chamber. Furthermore, by recessing the fasteners 118 fully into the polymeric window 104, the chance of a person accidentally contacting the fasteners 118 is greatly reduced; such fasteners 118 may not be at a touch-safe temperature, so this reduces the risk of burns. In some implementations, the polymeric window may be installed after the rest of the assembly is installed in the wall of a semiconductor processing chamber, and the bores in the polymeric window for the fasteners 118 may be blind bores that completely cover the fasteners when installed, thereby completely shielding them from contact with users. The first O-ring 112 may be used to hold the glass window 106 in place, but may not necessarily form a vacuum-tight seal. Other suitable types of fixturing may be used to retain the glass window 106 in place as well; the depicted O-ring is merely one example of a relatively inexpensive solution for doing so.

In some implementations, the frame 110 may have one or more coated surfaces, e.g., using hard-anodizing. For example, in some implementations, the portion of the frame around or adjacent to the sapphire window (or other portions of the frame that may come into contact with the atmosphere within the processing chamber) may be coated with a hard anodized coating. Such coatings may protect the frame 110 from chemical attack.

Figure 4:
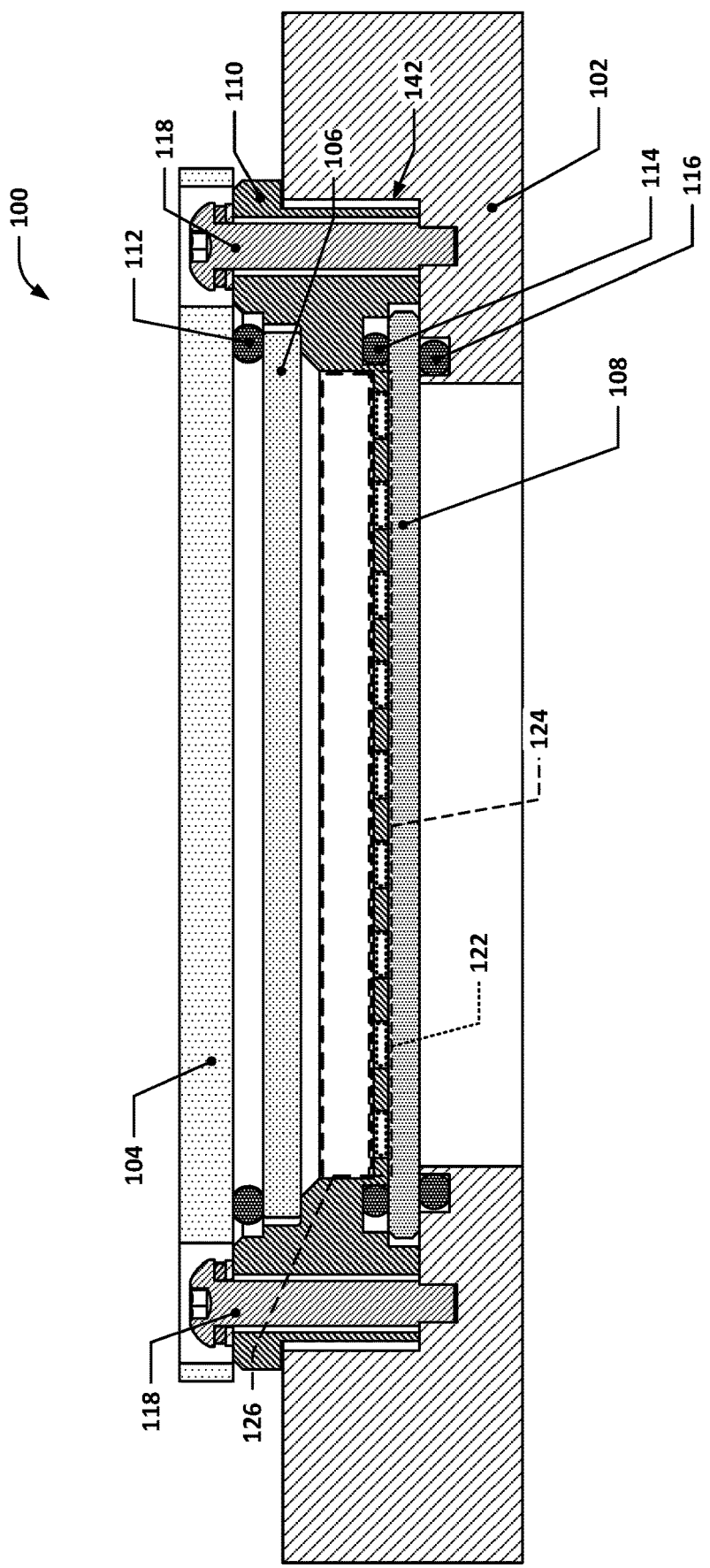
FIG. 4 depicts a side section view of the example plasma viewport of FIG. 1.

FIG. 4 depicts a side section view of the example plasma viewport of FIG. 1. FIG. 4 is essentially identical to FIG. 5, except that the plasma viewport 100 is shown installed into a receptacle 142 in a wall 102. As can be seen, the receptacle 142 may have an interior flange that may define an opening; the opening may typically be sized approximately the same as the aperture 126 of the frame 110, and the interior flange may contact the third O-ring 116 and provide part of the seal interface for the sapphire window 108 by acting as a compression surface for the third O-ring 116.

Figure 5:
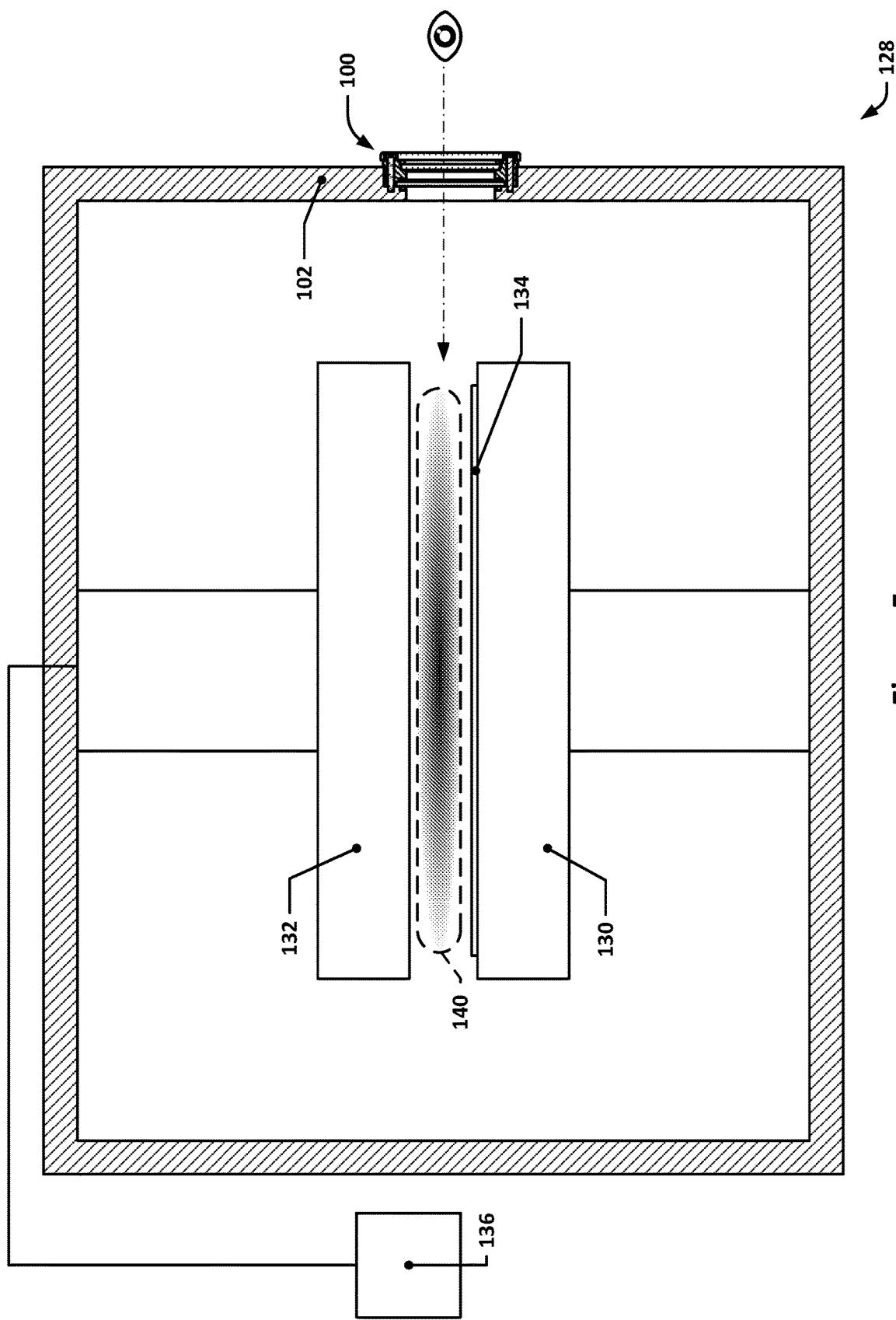
FIG. 5 depicts a diagram of a semiconductor processing chamber with a plasma viewport as shown in FIG. 1 installed.

FIG. 5 depicts a diagram of a semiconductor processing chamber with a plasma viewport as shown in FIG. 1 installed. In FIG. 5, a semiconductor processing chamber 128 is shown that has a wall 102 with a plasma viewport 100 installed therein. The processing chamber 128 may also include a pedestal 130 that may support a wafer 134 below a showerhead 132, which may act as an electrode that is connected with a radio-frequency generator 136. The radio-frequency generator 136 may be controlled, e.g., by a controller, to provide power to the showerhead 132/electrode while the showerhead is caused to provide a processing gas to the space above the wafer 134 in order to cause a plasma 140 to be struck. The plasma 140 may be viewed through the plasma viewport 100.

While there may be a variety of different dimensions and aspect ratios used for the various elements of a plasma viewport falling within the scope of this disclosure, the example plasma viewport 100 from the discussion above is sized to be mounted in a 10 cm diameter receptacle; the polymeric window 104 is thus sized to be somewhat larger in diameter than the outermost edge of the frame, at 10.6 cm in diameter, and may be approximately 5.7 mm thick. The glass window 106 may, for example, be approximately 7.5 cm in diameter and approximately 4 mm thick, and the sapphire window 108 may be approximately 8.2 cm in diameter and 3.3 mm thick. The aperture 126 may have a diameter of approximately 70 mm, and the gaps between the polymeric window 104 and the glass window 106, and the glass window 106 and the sapphire window 108, may be approximately 3 mm and 10 mm, respectively. The through-holes 122 in the perforated web 124 may have diameters of approximately 4 mm or less. Again, it will be understood that such dimensions are provided merely in the interest of providing a more complete description of the example implementation, but that other implementations having other dimensional characteristics are also considered to be within the scope of this disclosure.

Semiconductor processing tools that include plasma viewports as described herein may include a controller that controls various aspects of the tool, e.g., the activation of the radio-frequency generator, activation of valves to control gas supplies, robots for placing and removing wafers, etc. The controller may be part of a system that may include semiconductor processing equipment, including a processing tool or tools, chamber or chambers, platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, as well as various parameters affecting semiconductor processing, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The term "wafer," as used herein, may refer to semiconductor wafers or substrates or other similar types of wafers or substrates. A wafer station, as the term is used herein, may refer to any location in a semiconductor processing tool in which a wafer may be placed during any of various wafer processing operations or wafer transfer operations. Wafer support is used herein to refer to any structure in a wafer station that is configured to receive and support a semiconductor wafer, e.g., a pedestal, an electrostatic chuck, a wafer support shelf, etc.

References herein to "substantially," "approximately," or the like may be understood, unless otherwise indicated, to refer to values or relationships within ±10% of those stated. For example, two surfaces that are substantially perpendicular to one another may be either truly perpendicular, i.e., at 90° to one another, at 89° or 91° to one another, or even as far as at 80° or 100° to one another.

It is also to be understood that any use of ordinal indicators, e.g., (a), (b), (c), . . . , herein is for organizational purposes only, and is not intended to convey any particular sequence or importance to the items associated with each ordinal indicator. There may nonetheless be instances in which some items associated with ordinal indicators may inherently require a particular sequence, e.g., "(a) obtain information regarding X, (b) determine Y based on the information regarding X, and (c) obtain information regarding Z"; in this example, (a) would need to be performed (b) since (b) relies on information obtained in (a)-(c), however, could be performed before or after either of (a) and/or (b).

It is to be understood that use of the word "each," such as in the phrase "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, when a selected item may have one or more sub-items and a selection of one of those sub-items is made, it will be understood that in the case where the selected item has one and only one sub-item, selection of that one sub-item is inherent in the selection of the item itself.

It will also be understood that references to multiple controllers that are configured, in aggregate, to perform various functions are intended to encompass situations in which only one of the controllers is configured to perform all of the functions disclosed or discussed, as well as situations in which the various controllers each perform subportions of the functionality discussed.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. An apparatus comprising:
   a frame defining an aperture that extends between an interior side and an exterior side;
   a first window sealed against the frame, sized larger than the aperture, and completely overlapping the aperture when viewed along a direction perpendicular to a largest surface of the first window;
   a glass window; and
   a polymeric window sized larger than the aperture, completely overlapping the aperture when viewed along a direction perpendicular to a largest surface of the polymeric window, and secured to the exterior side of the frame, wherein:
   the first window is positioned closer to the interior side of the frame than the polymeric window,
   the glass window is interposed between the first window and the polymeric window,
   the first window is made of a fluorine-resistant, high-temperature stable material that has optical transmissivity of 80% in at least 80% of the visual light spectrum, and
   the frame supports the first window, the glass window, and the polymeric window in a spaced-apart configuration.

2. The apparatus of claim 1, wherein the first window is made of sapphire.

3. The apparatus of claim 1, further comprising:
   a first elastomeric O-ring interposed between the first window and the frame.

4. The apparatus of claim 3, further comprising:
   a second elastomeric O-ring interposed between the glass window and the polymeric window.

5. The apparatus of claim 1, wherein the glass window is made of borosilicate glass.

6. The apparatus of claim 1, wherein the glass window has a composition by weight of 70% silica, 11.5% boron oxide, 9.5% sodium oxide, 7.5% potassium oxide, 1% barium oxide, with the remainder including titanium oxide, calcium oxide, and any impurities.

7. The apparatus of claim 1, wherein the frame includes a perforated web that spans the aperture, the perforated web having a pattern of through-holes sized approximately 4 millimeters or less in diameter.

8. The apparatus of claim 7, wherein the through-holes are arranged in a hexagonal lattice pattern.

9. The apparatus of claim 7, wherein the perforated web is interposed between the first window and the glass window.

10. The apparatus of claim 1, wherein the frame comprises an aluminum alloy and at least a surface on a side of the frame adjacent to the first window has a hard-anodized coating.

11. The apparatus of claim 1, wherein the polymeric window comprises a polycarbonate material.

12. The apparatus of claim 1, wherein the polymeric window, when viewed along the direction perpendicular to the largest surface of the first window, completely overlaps the frame.

13. The apparatus of claim 1, wherein the polymeric window is held in place relative to the frame using fasteners selected from the group consisting of star-point screws, anti-tamper star-point screws, spanner head screws, one-way screws, and anti-tamper screws.

14. The apparatus of claim 1, further comprising:
    a wall having a receptacle sized to receive the frame, wherein:
    the frame is set in the receptacle and the receptacle includes an interior flange,
    the interior flange defines an opening, and
    the first window is sized larger than the opening; and
    an elastomeric O-ring that is interposed between the first window and the interior flange.

15. The apparatus of claim 14, wherein the elastomeric O-ring is compressed between the interior flange and the first window.

16. The apparatus of claim 14, further comprising a semiconductor processing chamber, wherein the wall is a wall of the semiconductor processing chamber.

17. The apparatus of claim 16, further comprising:
    a radio frequency (RF) generator; and
    an RF electrode, wherein:
    the RF generator is electrically connected to the RF electrode,
    the RF generator is configured to generate a plasma within the semiconductor processing chamber using the RF electrode, and
    the receptacle is positioned in the wall such that there is a line of sight through the first window, the glass window, and the polymeric window to a location in the semiconductor processing chamber where the RF generator and the RF electrode are configured to generate the plasma.

18. A semiconductor processing tool comprising:
    a semiconductor processing chamber, the semiconductor processing chamber having an exterior wall;
    a radio-frequency (RF) generator;
    an RF electrode located within the semiconductor processing chamber; and
    a plasma viewport, the plasma viewport having:
    a frame defining an aperture that extends between an interior side and an exterior side;
    a first window sealed against the frame, sized larger than the aperture, and completely overlapping the aperture when viewed along a direction perpendicular to a largest surface of the first window;
    a glass window; and
    a polymeric window sized larger than the aperture, completely overlapping the aperture when viewed along a direction perpendicular to a largest surface of the polymeric window, and secured to the exterior side of the frame, wherein:
    the first window is positioned closer to the interior side of the frame than the polymeric window, such that the first window is interposed between the processing chamber and the glass window;
    the glass window is interposed between the first window and the polymeric window,
    the first window is made of a fluorine-resistant, high-temperature stable material that has optical transmissivity of 80% in at least 80% of the visual light spectrum, and the frame supports the first window, the glass window, and the polymeric window in a spaced-apart configuration.

19. The semiconductor processing tool of claim 18, wherein the first window is made of sapphire.

* * * * *